United States Patent [19]

Ellenberger et al.

[11] Patent Number: 4,500,563
[45] Date of Patent: Feb. 19, 1985

[54] INDEPENDENTLY VARIABLY CONTROLLED PULSED R.F. PLASMA CHEMICAL VAPOR PROCESSING

[75] Inventors: Charles E. Ellenberger; George L. Bower, both of Elko, Nev.; William R. Snow, Sunnyvale, Calif.

[73] Assignee: Pacific Western Systems, Inc., Mountain View, Calif.

[21] Appl. No.: 434,859

[22] Filed: Dec. 15, 1982

[51] Int. Cl.³ .................. C23C 13/08; H01L 21/306
[52] U.S. Cl. .......................... 427/38; 427/39; 118/723; 118/698; 156/643; 156/345; 156/662
[58] Field of Search ............. 427/38, 39, 255, 86, 427/94; 118/50.1, 723, 698; 156/643, 345, 662

[56] References Cited

U.S. PATENT DOCUMENTS

| 3,677,799 | 7/1972 | Hou | 427/38 |
|---|---|---|---|
| 4,223,048 | 9/1980 | Engle, Jr. | 427/39 |
| 4,263,088 | 4/1981 | Gorin | 156/643 X |
| 4,401,507 | 8/1983 | Engle | 118/723 X |

Primary Examiner—John D. Smith
Assistant Examiner—Bernard F. Plantz
Attorney, Agent, or Firm—Harry E. Aine

[57] ABSTRACT

Semiconductive wafers are processed, i.e., etched or layers deposited thereon, by means of a plasma enhanced chemical vapor processing system wherein the plasma is generated by a train of R.F. power pulses. The pulse repetition rate, pulse length and peak power level of the individual pulses are independently variably controlled to variably control the uniformity of the processing of the semiconductive wafers within the processing gaps.

8 Claims, 2 Drawing Figures

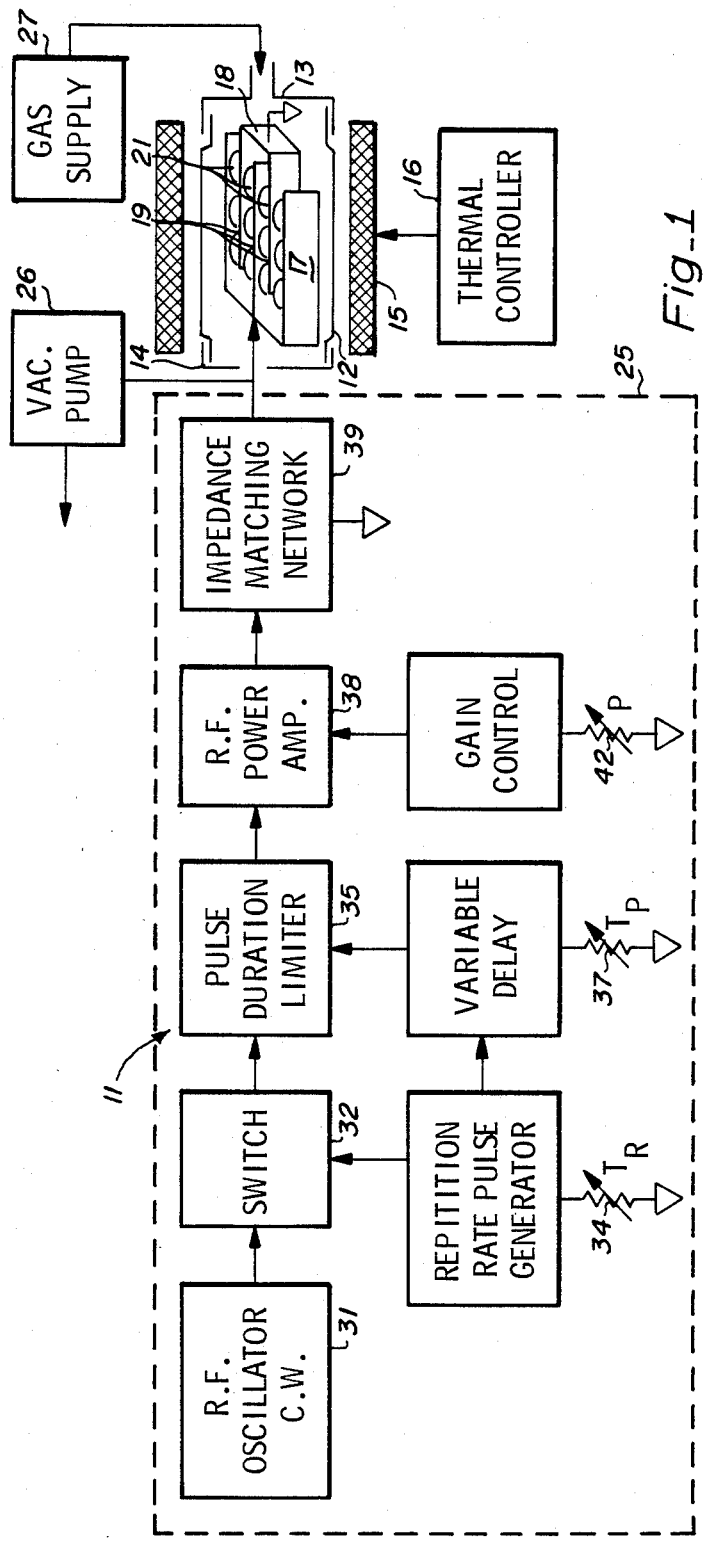
Fig_1
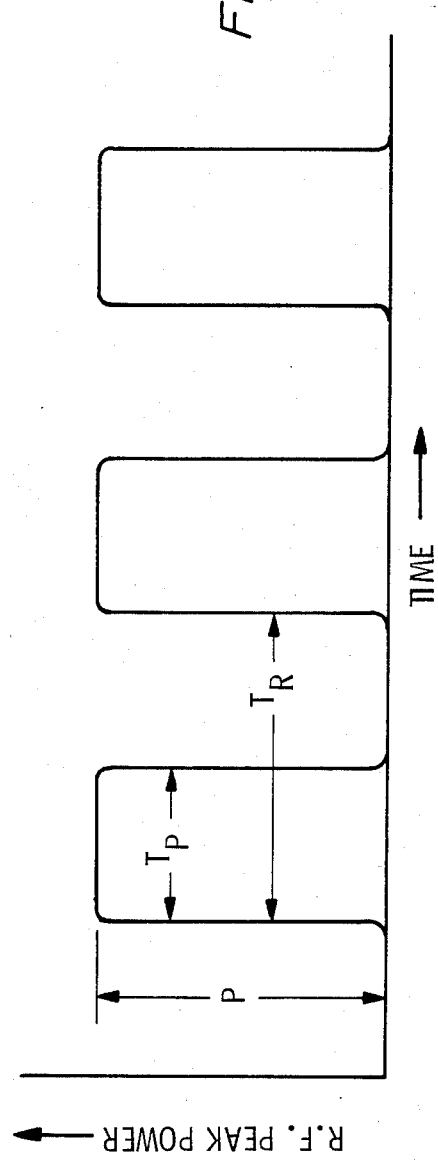
Fig_2

INDEPENDENTLY VARIABLY CONTROLLED PULSED R.F. PLASMA CHEMICAL VAPOR PROCESSING

BACKGROUND OF THE INVENTION

The present invention relates in general to plasma enhanced chemical vapor processing of semiconductive wafers, and, more particularly, to an improved method and apparatus for etching or depositing certain films or layers on the wafers with improved uniformity due to independent variable control over the repetition, rate, pulse duration and peak power level of the R.F. power pulses applied to the electrodes to establish the plasma.

DESCRIPTION OF THE PRIOR ART

Heretofore, plasma enhanced chemical vapor processing of semiconductive wafers has been conducted within an evacuable horizontal, tubular envelope disposed within a surrounding heater or furnace for maintaining a uniform temperature within the central region of the elongated, tubular envelope. Two sets of interleaved generally planar electrodes were disposed within the evacuable envelope for establishing an electrical plasma discharge in wafer processing gaps defined between the interleaved electrodes. Wafers were loaded into the processing gaps vertically with the major face of each wafer facing into the process gap. The electrodes were energized with pulsed R.F. power and a chemical vapor is caused to flow axially through the evacuable tube and through the electrical plasma discharge at subatmospheric pressure to produce chemically active vapor products of the plasma discharge which interact with the faces of the wafers facing into the processing gaps for processing of the wafers.

Such a prior art plasma enhanced chemical vapor processing method and apparatus is disclosed in U.S. Pat. No. 4,223,048 issued Sept. 16, 1980, the disclosure of which is hereby incorporated by reference in its entirety.

One of the problems associated with the prior art plasma enhanced chemical vapor processing method and apparatus was that at high power levels the chemical vapor was depleted of its reactive products not only over the length of the reactor but over the diameters of the wafers producing a non-uniformity of the wafer processing. Decreasing the average power supplied to the plasma by decreasing the conduction angle of the SCR controlled pulsed power to the R.F. generator, improved the processing uniformity but there was a minimum average power level below which the plasma did not fill all the volume within the wafer processing gaps. This resulted in nonuniform wafer processing. Varying the conduction angle of the SCR varied the duty cycle and average power as well as peak power level due to the impedance characteristic of the plasma discharge.

SUMMARY OF THE PRESENT INVENTION

The principal object of the present invention is the provision of an improved plasma enhanced chemical vapor processing method and apparatus for processing of semiconductive wafers.

In one feature of the present invention, the peak power level of the R.F. power is variably controlled essentially independently of the pulse duration and the pulse repetition rate, to variably control the distribution of the plasma discharge within the processing gaps for variably controlling uniformity of the processing of the semiconductive wafers within the processing gaps.

In another feature of the present invention, the pulse duration of the radio frequency power pulses is variably controlled, essentially independently of the peak power level and the pulse repetition rate, to variably control the depletion of the chemically reactive vapor products to variably control the uniformity of the processing of the semiconductive wafers within the processing gaps.

In another feature of the present invention, the pulse repetition rate of the radio frequency power pulses is variably controlled essentially independently of the peak power level and the pulse duration, to variably control the resupply of the chemically reactive vapor products of the plasma discharge to variably control the uniformity of the processing of the semiconductive wafers within the processing gaps.

Other features and advantages of the present invention will become apparent upon a perusal of the following specification taken in connection with the accompanying drawings wherein:

BRIEF DESCRIPTION OF THE DRAWINGS

FIG. 1 is a schematic circuit diagram, partially in block diagram form and partially schematic, of a plasma enhanced chemical vapor processing system incorporating features of the present invention, and FIG. 2 is a plot of R.F. peak power level vs. time depicting the variables of peak power level, P, pulse duration, $T_p$, and pulse repetition rate, $T_R$.

DESCRIPTION OF THE PREFERRED EMBODIMENTS

Referring now to FIG. 1 there is shown a plasma and chemical vapor processing apparatus 11 for processing semiconductive wafers and incorporating features of the present invention. The processing system 11 includes an elongated tubular evacuable envelope 12, as of quartz, having an inside diameter of, for example, 155 millimeters. Opposite ends of the tubular envelope 12 are outwardly flanged to receive end caps 13 and 14, respectively, as of aluminum. Rubber o-ring seals, not shown, provide a gas tight seal between the respective end caps and the flanged ends of the tubular envelope 12.

A three-segment resistance heating element 15 surrounds the tubular envelope 12. The resistance heating elements are heated to the desired temperature by means of current fed therethrough from a thermal controller 16. The thermal controller 16 and heating elements comprise a furnace which is commercially available as a diffusion furnace from Mel Pat Industries of Santa Cruz, Calif.

First and second sets of interleaved generally planar elongated electrodes 17 and 18 are disposed within the central region of the elongated tubular envelope 12 for defining a plurality of processing gaps 19 in the spaces between the interleaved electrodes 17 and 18.

The electrodes 17 of the first set are electrically conductively connected together and electrically insulated from the second set of electrodes 18.

Semiconductive wafers 21, which are to be processed, are disposed with one major face adjacent the electrode 17 or 18 and the other major face facing into the respective processing gap 19. The wafers are held adjacent the respective electrodes by means of clips, which are fully disclosed in the aforecited U.S. Pat. No. 4,223,048.

The first and second interleaved electrodes sets 17 and 18 are connected to opposite terminals of an R.F. power supply 25 via feedthrough insulators passing through end caps 14. Feedthrough conductors are coupled to the respective electrode sets 17 and 18 within the tubular envelope 12, so that when one set of the electrodes, for example 17, is positive the other set of electrodes 18 is negative with a potential difference, V, between the electrodes. In a typical example the R.F. generator 25 has a frequency of 450 kilohertz.

The evacuable envelope 12 is evacuated by means of a roots blower and a mechanical vacuum pump collectively referred to herein as vacuum pump 26. The vacuum pump 26 is connected in gas communication with chamber 12 via a port centrally disposed of end cap 14.

Chemical vapors to be employed in the chemical vapor processing apparatus 11 are contained within various gas bottles connected in gas communication with the evacuable chamber via tubulation and flow controllers collectively referred to herein as the gas supply 27. The output of the gas supply 27 is fed into the evacuable chamber through end cap 13. In operation, the flow of the gaseous vapor constituents is axially of the evacuable tube 12 and interleaved electrode structures 17 and 18 to the exhaust port in end cap 14 and thence to the vacuum pump 26.

The R.F. power supply 25 includes an R.F. continuous wave oscillator 31 having a radio frequency of, for example, 450 kilohertz, which directs its output power into a switch 32. The switch 32 is either open or closed depending upon the output of a repetition rate pulse generator 33 which supplies its output to control operation of the switch 32. The repetition rate pulse generator 33 supplies pulses which open the switch 32 for nearly the full length of the repetition rate period, $T_R$, (See FIG. 2) of the pulse generator 33. However, the period, $T_R$, or inverse of the pulse repetition rate of the pulse generator 33, is variably controlled by means of a potentiometer 34 under the manual control of the operator.

The output of the R.F. oscillator which passes through the switch 32 is fed into a pulse duration limiter 35 which limits or attenuates the pulses of R.F. power passing through the switch 32 in accordance with the setting of a variable delay 36 which delays the effect of the limiter 35 from the leading edge of the output pulses of the repetition rate pulse generator 33 which are fed into one input of the variable delay 36. The output of the variable delay 36 initiates operation of the pulse duration limiter 35 so as to limit or attenuate the pulses of R.F. power passing through the switch 32. The operator controls the amount of the variable delay by means of a variable potentiometer 37 connected in circuit with the variable delay 36. By adjusting the setting of the potentiometer 37, the operator variably controls the pulse duration of the pulses of R.F. power passing from the switch 32 through the pulse duration limiter 35.

The R.F. pulse output of the pulse duration limiter 35 is fed to the input of an R.F. power amplifier 38 which amplifies the R.F. power pulses and feeds them to the interleaved electrodes 17 and 18 for establishing the plasma discharge in the processing gaps 19. An impedance matching network 39 is placed in circuit between the R.F. power amplifier 38 and the interleaved electrodes 17 and 18 for matching the impedance of the plasma discharge to the output impedance of the power amplifier 38 to minimize reflected power.

The peak power level, P, of the R.F. power supplied to the electrodes 17 and 18 is controlled by means of a gain control 41 controlling the gain of the R.F. power amplifier 38. The gain control 41 is independently adjustable by means of a potentiometer 42 under the manual variable control of the operator. Thus, the operator can control the peak power level, P, of the R.F. power supplied to the processing gaps 19, essentially independently of the pulse repetition rate period, $T_R$, and pulse duration, $T_p$.

In operation, the operator sets the peak power level, P, of the R.F. power applied to the processing gaps by controlling the setting of the potentiometer 42. The operator adjusts the potentiometer 42 to set the peak power level, P, at a level so as to essentially completely fill the processing gaps with plasma discharge. In this manner the operator controls the distribution of the plasma discharge within the processing gaps for variably controlling uniformity of the processing of the semiconductive wafers within the processing gaps.

The operator sets the pulse length $T_P$ of the R.F. pulses supplied processing gaps 19 via adjustment of potentiometer 37 so that the chemically reactive vapor products of the plasma discharge are not seriously depleted during each pulse of the R.F. power supplied to the electrode 17 and 18. In this manner, the operator variably controls the depletion of the reactive vapor products to variably control the uniformity of the processing of the semiconductive wafers within the processing gap.

The operator, by adjustment of potentiometer 34 controls the repetition rate or period, $T_R$, of the pulses of R.F. power supplied to the processing gaps 19. The operator adjusts setting of potentiometer 34 so that sufficient time is provided between successive R.F. pulses to allow for resupply of gas to be dissociated, or rendered chemically reactive, by the plasma discharge during each of the applied R.F. pulses. The operator independently adjusts setting of potentiometer 34 to variably control the resupply of reactive vapor products to control the uniformity of the processing of the semiconductive wafers within the processing gaps 19.

In summary, adjustment of the instantaneous or peak power level by potentiometer 42 allows operation at a plasma current density large enough that the plasma will distribute uniformity over the processing gaps. Adjustment of the pulse duration via a potentiometer 37 provides control of the depletion of the reactive vapor products, and control of repetition rate via potentiometer 34 provides adequate time for resupply of reactive vapor products by diffusion within the flow of gas through the processing gaps. Independent control of the pulse repetition rate, pulse duration, and peak power level allows variable control of the uniformity of the processing of the semiconductive wafers within the processing gaps and allows for substantially improved processing uniformity as contrasted to the prior art plasma enhanced chemical vapor processing method and apparatus wherein independent control of the pulse repetition rate, pulse duration and peak power level were not provided.

EXAMPLE

With the prior art plasma chemical vapor processing method and apparatus, $Si_3N_4$ was deposited on a batch of 87 4" silicon wafers to a thickness of approximately 10K Å in 35 minutes at a rate of 293 Å/min. with the following conditions: SiH$_4$ flow of 340 standard cubic centimeters per minute (SCCM), NH$_3$ flow of 2600 SCCM, pressure 2.0 torr, r.f. peak power of 750 watts, pulse repetition rate of 120 H$_z$, and pulse width of 1.6 ms. The measured uniformity of the thickness of the deposited layer was ±8.7% over the batch of 4" silicon wafers with an intra wafer uniformity of ±3.2%.

In the method and apparatus of the present invention, Si$_3$N$_4$ was deposited on similar wafers to a thickness of approximately 10K Å in 25 minutes at a rate of 398 Å/minute with the following conditions: SiH$_4$ flow of 270 SCCM, NH$_3$ flow of 1500 SCCM, pressure 2.0 torr, r.f. peak power of 1600 watts, pulse repetition rate of 6000 H$_z$, and pulse width of 0.05 ms. The measured uniformity of the thickness of the deposited layer was ±4.4% over the batch of 4" wafers with an intra wafer uniformity of ±1.2%, thereby showing a factor of two improvement, over the prior art, in uniformity at a significantly higher growth rate.

What is claimed is:

1. In a method for plasma enhanced chemical vapor processing of semiconductive wafers wherein an evacuable envelope contains first and second sets of interleaved electrodes, one set being electrically insulated relative to the other, for establishing an electrical plasma discharge within said evacuable envelope in processing gaps defined between the interleaved electrodes, the steps of:
   loading semiconductive wafers into the processing gaps;
   evacuating said envelope to subatmospheric pressure;
   introducing a vapor at subatmospheric pressure into said envelope;
   applying pulsed radio frequency power to said first and second sets of interleaved electrodes to establish an electrical plasma discharge at subatmospheric pressure in the processing gaps to produce chemically active vapor products of said plasma discharge;
   chemically interacting said chemically active vapor products with said wafers within said processing gaps for processing of said wafers; and
   variably controlling the peak power level of the radio frequency power pulses essentially independently of the pulse duration and pulse repetition rate of said pulsed radio frequency power to variably control the distribution of the plasma discharge within said processing gaps for variably controlling the uniformity of the processing of the semiconductive wafers within the processing gaps.

2. The method of claim 1 including the step of:
   variably controlling the pulse duration of the radio frequency power pulses essentially independently of the peak power level and of the pulse repetition rate of said pulses to variably control the depletion of the reactive vapor products to variably control the uniformity of the processing of the semiconductive wafers within the processing gaps.

3. The method of claim 1 including the step of:
   variably controlling the pulse repetition rate of the radio frequency power pulses essentially independently of the peak power level and the pulse duration of said pulses to variably control the rate of resupply of the reactive vapor products within said processing gaps to variably control the uniformity of the processing gaps.

4. In a method for plasma enhanced chemical vapor processing of semiconductive wafers wherein an evacuable envelope contains first and second sets of interleaved electrodes, one set being electrically insulated relative to the other, for establishing an electrical plasma discharge within said evacuable envelope in processing gaps defined between the interleaved electrodes, the steps of:
   loading semiconductive wafers into said processing gaps;
   evacuating said envelope to subatmospheric pressure;
   introducing a vapor at subatmospheric pressure into said envelope;
   applying radio frequency power to said first and second sets of interleaved electrodes to establish an electrical plasma discharge at subatmospheric pressure in said processing gaps to produce chemically active vapor products of said plasma discharge;
   chemically interacting said chemically active vapor products with said wafers within said processing gaps for processing said wafers; and
   variably controlling the pulse duration of the radio frequency power pulses essentially independently of the peak power level and the pulse repetition rate of said pulses to variably control the depletion of the reactive vapor products in said processing gaps to variably control the uniformity of the processing of the semiconductive wafers within said processing gaps.

5. In a method for plasma enhanced chemical vapor processing of semiconductive wafers wherein an evacuable envelope contains first and second sets of interleaved electrodes, one set being electrically insulated relative to the other, for establishing an electrical plasma discharge within said evacuable envelope in processing gaps defined between said interleaved electrodes, the steps of:
   loading semiconductive wafers into said processing gaps;
   evacuating said envelope to subatmospheric pressure;
   introducing a vapor at subatmospheric pressure into said envelope;
   applying pulsed radio frequency power to said first and second sets of interleaved electrodes to establish an electrical plasma discharge at subatmospheric pressure in said processing gaps to produce chemically active vapor products of said plasma discharge;
   chemically interacting said chemically active vapor products with said loaded wafers for processing of said wafers; and
   variably controlling the pulse repetition rate of the radio frequency power pulses essentially independently of the peak power level and the pulse duration of said pulses to variably control the resupply of reactive vapor products within said gaps to variably control the uniformity of the processing of the semiconductive wafers within said processing gaps.

6. In a plasma enhanced chemical vapor processing apparatus for processing semiconductive wafers within an evacuable envelope for containing the plasma enhanced chemical vapor and semiconductive wafers at subatmospheric pressure;
   first and second sets of electrode means for disposition within the envelope, one set of said electrodes means being electrically insulated from the other, and said first and second sets of electrode means being interleaved with each other for establishing, when energized with electrical potential, an electrical plasma discharge within said evacuable envelope in the processing gaps defined between adjacent ones of said interleaved electrode means;

means for holding semiconductive wafers in said processing gaps;

means for applying pulsed radio frequency power to said first and second sets of interleaved electrodes to establish an electrical plasma discharge at subatmospheric pressure in said processing gaps to produce chemically active vapor products of said plasma discharge for chemically interacting with said wafers within said processing gaps for processing of said wafers; and means for variably controlling the peak power level of the radio frequency power essentially independently of the pulse duration and the pulse repetition rate of said pulses for variably controlling the distribution of the plasma discharge within said processing gaps for variably controlling the uniformity of the processing of the semiconductive wafers within said processing gaps.

7. The apparatus of claim 6 including, means for variably controlling the pulse duration of the radio frequency power pulses essentially independently of the peak power level and the pulse repetition rate of said pulses to variably control the depletion of the chemically active vapor products within said gaps to variably control the uniformity of the processing of the semiconductive wafers within said processing gaps.

8. The apparatus of claim 6 including, means for variably controlling the pulse repetition rate of the radio frequency power pulses essentially independently of the peak power level and the pulse repetition rate of said pulses to variably control the resupply of the chemically active vapor products within said processing gaps for variably controlling the uniformity of the processing of the semiconductive wafers within said processing gaps.

* * * * *